(12) United States Patent
Sankaran et al.

(10) Patent No.: US 8,786,328 B2
(45) Date of Patent: Jul. 22, 2014

(54) RF LOGIC DIVIDER

(75) Inventors: Swaminathan Sankaran, Allen, TX (US); Sudipto Chakraborty, Richardson, TX (US); Per T. Roine, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/611,691

(22) Filed: Sep. 12, 2012

(65) Prior Publication Data

US 2014/0070853 A1   Mar. 13, 2014

(51) Int. Cl.
*H03K 21/00* (2006.01)
(52) U.S. Cl.
USPC .............. 327/115; 327/117; 327/218; 331/51
(58) Field of Classification Search
USPC .......................................................... 327/115
See application file for complete search history.

(56) References Cited

U.S. PATENT DOCUMENTS

| 4,119,867 A | 10/1978 | Morokawa et al. |
| 5,155,379 A * | 10/1992 | Narahara ...................... 327/292 |
| 2004/0251935 A1* | 12/2004 | Chen et al. ..................... 327/117 |
| 2007/0210843 A1* | 9/2007 | Takai ............................. 327/158 |
| 2008/0042699 A1 | 2/2008 | Narathong et al. |
| 2009/0256596 A1 | 10/2009 | Oh |
| 2010/0073027 A1 | 3/2010 | Zhang et al. |
| 2010/0219873 A1* | 9/2010 | Chang et al. .................. 327/333 |

FOREIGN PATENT DOCUMENTS

JP    2001257567    9/2001

OTHER PUBLICATIONS

Tokheim, Digital Electronics Principal and Application, Glencoe McGraw-Hill, Fifth edition.*

* cited by examiner

*Primary Examiner* — Lincoln Donovan
*Assistant Examiner* — Patrick Chen
(74) *Attorney, Agent, or Firm* — Alan A. R. Cooper; Frederick J. Telecky, Jr.

(57) ABSTRACT

An apparatus is provided. Latches are coupled in series with one another in a ring configuration. Each latch includes a tri-state inverter, a first resistor-capacitor (RC) network, and a second RC network. The tri-state inverter has a first clock terminal and a second clock terminal. The first RC network is coupled to the first clock terminal. The second RC network is coupled to the second clock terminal. A biasing network is also provided. The biasing network has a first bias voltage generator that is coupled to the first RC network for each latch and a second bias voltage generator that is coupled to the second RC network for each latch.

12 Claims, 2 Drawing Sheets

RF LOGIC DIVIDER

TECHNICAL FIELD

The invention relates generally to a divider and, more particularly, to a radio frequency (RF) logic divider.

BACKGROUND

Turning to FIG. 1, an example of a conventional phase lock loop (PLL) 100 can be seen. In operation, a phase/frequency detector (PFD) 102 is able to generate an up signal UP and a down signal DN for the charge pump 104 based on a comparison between a reference signal REF and a feedback signal FB. The charge pump 104 is then able to vary the charge held on low pass filter (LPF) 106 based on the signals UP and DN. The charge held on the LPF 106 can then be used by the voltage controlled oscillator (VCO) 108 to generate an output signal FOUT, and the output signal FOUT can be divided by the divider 110 to generate the feedback signal FB. As a result, the frequency of the output signal FOUT can be chosen from the reference signal REF.

Of interest here, however, is the divider 110. PLLs (like PLL 110) can be used in RF synthesizers, which can, for example, produce local oscillator signals for RF modulators, and the dividers (like divider 110) can be dynamic-logic based dividers or current mode logic dividers. As an example of a digital dynamic-logic divider that is comprised of two tri-state inverters (e.g., transistors Q1 to Q8) that are coupled in series with one another to form a ring can be seen in FIG. 2. These tri-state inverters (e.g., transistors Q1 to Q8) are coupled between voltage rails VDD and VSS and are coupled to the VCO terminals of VCO 108 so as to receive signals CLK and CLKB. These dividers, however, can have very high current consumption, which makes them impractical for low current (e.g., sub-mA) radios. Therefore, there is a need for an improved divider with lower current consumption.

An example of a conventional circuit is U.S. Pat. No. 4,119,867.

SUMMARY

In accordance with the present invention, an apparatus is provided. The apparatus comprises a plurality of latches coupled in series with one another in a ring configuration, wherein each latch includes: a tri-state inverter with a first clock terminal and a second clock terminal; a first resistor-capacitor (RC) network that is coupled to the first clock terminal; and a second RC network that is coupled to the second clock terminal; and a biasing network having: a first bias voltage generator that is coupled to the first RC network for each latch; and a second bias voltage generator that is coupled to the second RC network for each latch.

In accordance with the present invention, the first RC network further comprises: a capacitor that is coupled to the first clock terminal and that is configured to receive a clock signal; and a resistor that is coupled to the first clock terminal and the first bias voltage generator.

In accordance with the present invention, the capacitor, resistor, and clock signal further comprise a first capacitor, a first resistor, and a first clock signal, and wherein the second RC network further comprises: a capacitor that is coupled to the first clock terminal and that is configured to receive a clock signal; and a resistor that is coupled to the first clock terminal and the first bias voltage generator.

In accordance with the present invention, the tri-state inverter further comprises: an input terminal; an output terminal; a first PMOS transistor that is coupled to the input terminal at its gate; a second PMOS transistor that is coupled to the drain of the first PMOS transistor at its source, the first clock terminal at its gate, and the output terminal at its drain; a first NMOS transistor that is coupled to the second clock terminal at its gate and the output terminal at its drain; and a second NMOS transistor that is coupled to the source of the first NMOS transistor at its drain and the input terminal at its gate.

In accordance with the present invention, the first bias voltage generator further comprises: a third PMOS transistor that is coupled to the first resistor of each latch at its gate and drain; and an adjustable current source that is coupled to the gate and drain of the third PMOS transistor.

In accordance with the present invention, the adjustable current source further comprises a first adjustable current source, and wherein the second bias voltage generator further comprises: a third NMOS transistor that is coupled to the second resistor of each latch at its gate and drain; and an adjustable current source that is coupled to the gate and drain of the third NMOS transistor.

In accordance with the present invention, an apparatus is provided. The apparatus comprises a first latch having: a first tri-state inverter with a first input terminal, a first output terminal, a first clock terminal, and a second clock terminal; a first resistor-capacitor (RC) network that is coupled to the first clock terminal, wherein the first RC network is configured to receive a first clock signal; and a second RC network that is coupled to the second clock terminal, wherein the second RC network is configured to receive a second clock signal; a second latch having: a second tri-state inverter with a second input terminal, a second output terminal, a third clock terminal, and a fourth clock terminal, wherein the second output terminal is coupled to the first input terminal; a third resistor-capacitor (RC) network that is coupled to the third clock terminal, wherein the third RC network is configured to receive the second clock signal; and a fourth RC network that is coupled to the fourth clock terminal, wherein the fourth RC network is configured to receive the first clock signal; a biasing network having: a first bias voltage generator that is coupled to the first and third RC networks; and a second bias voltage generator that is coupled to the second and fourth RC networks; and an inverter that is coupled to the first output terminal and the second input terminal.

In accordance with the present invention, each of the first, second, third, and fourth RC networks further comprises: a capacitor that is coupled to its clock terminal; and a resistor that is coupled to its clock terminal and its bias voltage generator.

In accordance with the present invention, each of the first and second tri-state inverters further comprises: a first PMOS transistor; a second PMOS transistor that is coupled to the drain of the first PMOS transistor at its source; a first NMOS transistor that is coupled to the drain of the second PMOS transistor at its drain; and a second NMOS transistor that is coupled to the source of the first NMOS transistor at its drain and the gate of the first PMOS transistor at its gate.

In accordance with the present invention, an apparatus is provided. The apparatus comprises a phase/frequency detector (PFD) that is configured to receive a reference signal; a charge pump that is coupled to the PFD; a low pass filter (LPF) that is coupled to the charge pump; a voltage controller oscillator (VCO) that is coupled to the LPF, wherein the VCO has a first VCO terminal and a second VCO terminal; and a divider having: a first latch having: a first tri-state inverter with a first input terminal, a first output terminal, a first clock terminal, and a second clock terminal; a first resistor-capacitor (RC) network that is coupled to the first clock terminal, wherein the first RC network is coupled to the first VCO terminal; and a second RC network that is coupled to the second clock terminal, wherein the second RC network is coupled to the second VCO terminal; a second latch having: a second tri-state inverter with a second input terminal, a second output terminal, a third clock terminal, and a fourth clock terminal, wherein the second output terminal is coupled to the first input terminal and to the PFD; a third resistor-capacitor (RC) network that is coupled to the third clock terminal, wherein the third RC network coupled to the second VCO terminal; and a fourth RC network that is coupled to the fourth clock terminal, wherein the fourth RC network is coupled to the first VCO terminal; a biasing network having: a first bias voltage generator that is coupled to the first and third RC networks; and a second bias voltage generator that is coupled to the second and fourth RC networks; and an inverter that is coupled to the first output terminal and the second input terminal.

In accordance with the present invention, the VCO is configured to output first and second clock signals through the first and second VCO terminals, and wherein the second clock signal is an inverse of the first clock signal.

In accordance with the present invention, the divider is configured to divide the first and second clock signals by 2.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
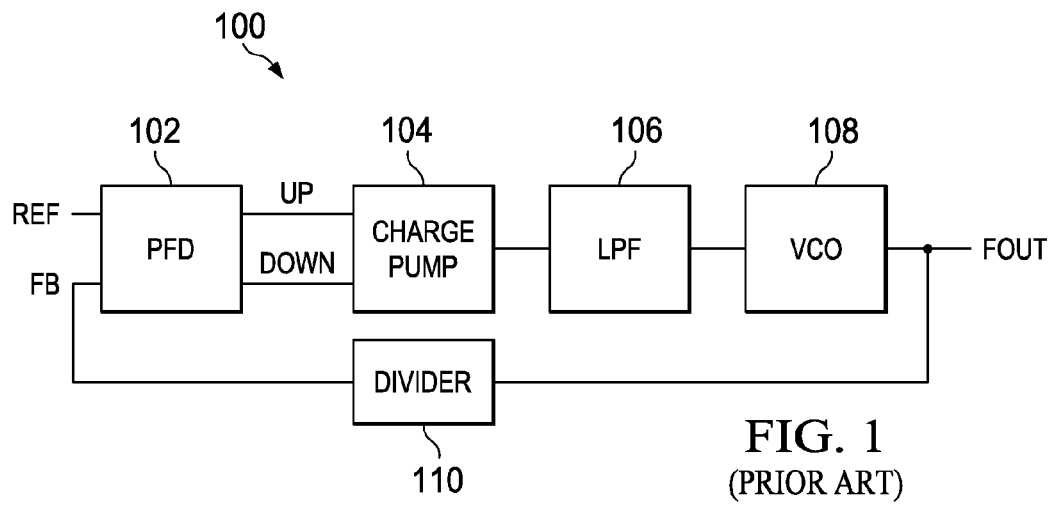
FIG. 1 is a diagram of an example of a conventional PLL.
Figure 2:
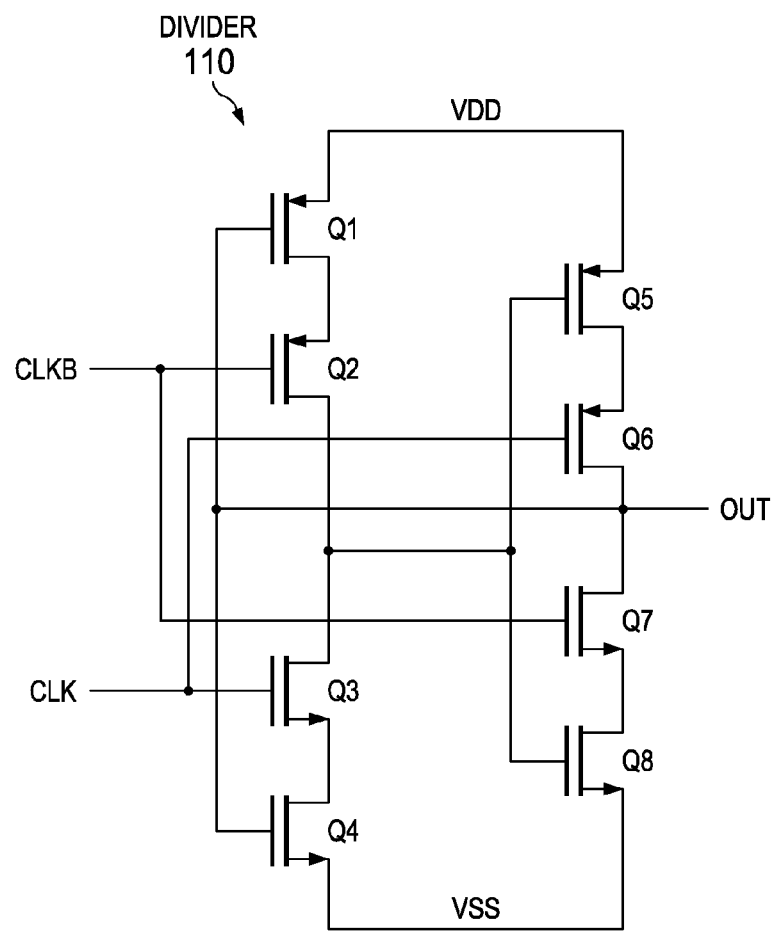
FIG. 2 is a diagram of an example of a conventional divider within the PLL of FIG. 1.

Refer now to the drawings wherein depicted elements are, for the sake of clarity, not necessarily shown to scale and wherein like or similar elements are designated by the same reference numeral through the several views.

Figure 3:
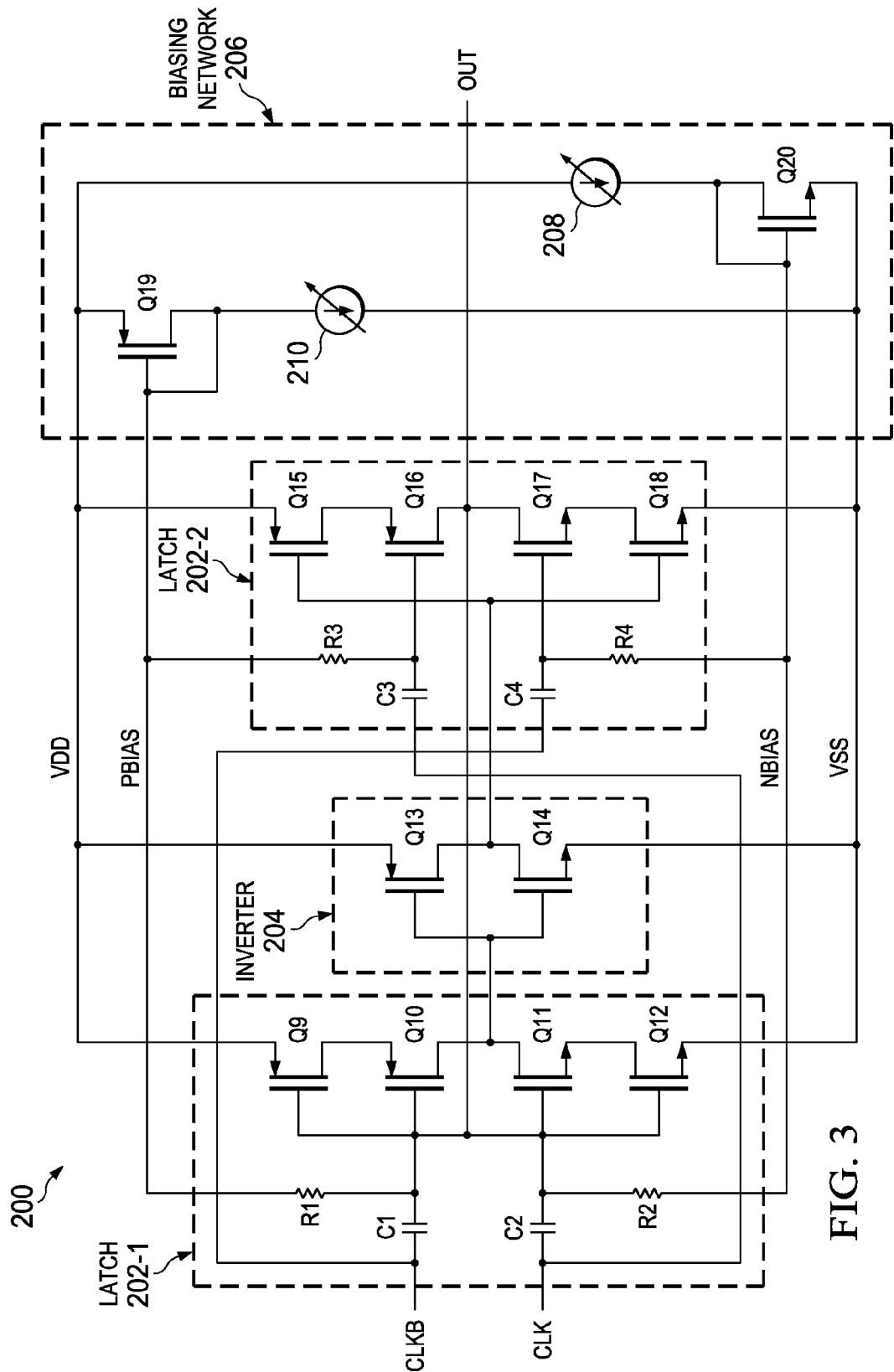
FIG. 3 is a diagram of an example of a divider in accordance with the present invention that can be used in the PLL of FIG. 1.

Turning to FIG. 3, an example of a divider 200 in accordance with the present invention can be seen. As shown in this example, divider 200 is a divide-by-2 divider, and this divider 200 can replace divider 110 in PLL 100. Divider 200 is generally comprised of cascaded latches 202-1 and 202-2 coupled together to form a ring with an inverter 204 (which is generally comprised of PMOS transistor Q13 and NMOS transistor Q14) interposed therebetween. Additional stages (e.g., latches and inverters) may be added to increase the division ratio. These latches 202-1 and 202-2 can receive clock signals CLK and CLKB (which are, for example and as shown, inverses of one another) and generate output signal OUT. Bias network 206 is also included to provide bias voltages PBIAS and NBIAS to the latches 202-1 and 202-2.

In operation, the divider 200 is able to receive, for example, a clock signals CLK and CLKB (which, in this example, form a differential clock signal that can be supplied from VCO terminals of VCO 108) and to produce, for example, a single-ended output signal OUT having a frequency that is one-half of the differential clock signal CLK/CLKB. These latches 202-1 and 202-2 generally comprise tri-state inverters (e.g., MOS transistors Q9 to Q12 and Q15 to Q18) that have input terminals, output terminals, and clock terminals and resistor-capacitor (RC) networks (e.g., R1/C1 to R4/C4). In this example, the signal CLKB is applied to the clock terminals of the tri-state inverters (e.g., gates of PMOS transistor Q10 and NMOS transistor Q16) through RC networks (e.g., R1/C1 and R4/C4), and, in this example, signal CLK is applied to the clock terminals of the tri-state inverters (e.g., gates of NMOS transistor Q11 and PMOS transistor Q17) through RC networks (e.g., R2/C2 and R3/C3). Capacitors C1 to C4, in this example, should have capacitances that are larger than the capacitance of transistors Q10, Q11, Q16, and Q17. This can allow the latches 202-1 and 202-2 to toggle on the appropriate edges of the differential clock signal CLK/CLKB.

To allow the latches 202-1 and 202-2 to operate with lower dynamic currents, the gates of transistors Q10, Q11, Q16, and Q17 can be biased. In particular, the bias voltage PBIAS applied through resistors R1 and R3 and the bias voltage NBIAS applied through resistors R2 and R4 cause the gate voltages of transistors Q10, Q11, Q16, and Q17 to be near or above their respective threshold voltages during operation. This means that smaller voltages applied to the gates of transistors Q10, Q11, Q16, and Q17 can cause the latches 202-1 and 202-2 to toggle. Typically, bias voltages PBIAS and NBIAS can be generated with the use of adjustable current sources 208 and 210 (e.g., current digital-to-analog converter or DAC) and diode-connected transistors Q19 and Q20. As shown in this example, PMOS transistor Q19 can be a scaled version of PMOS transistors Q10 and Q16, and NMOS transistor Q20 can be a scaled version of NMOS transistors Q11 and Q17. Alternatively, each latch 202-1 and 202-2 can include a biasing network 206 instead of sharing bias network 206 as shown. Also, as another alternative, the current sources 208 and 210 can be fixed or generally constant current sources. Bias voltages PBIAS and NBIAS could alternatively be generated from a programmable/fixed resistor divider between supply rails.

As a result of employing this configuration, several advantages can be realized. First, the divider 200 can have lower current consumption than traditional dividers (e.g., divider 110). Second, the biasing network 206 can be configured to provide a self-adaptive bias to circumvent mismatches related to process and temperature variation. Third, the dynamic range can be improved through a direct current (DC) bias setting.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of latches coupled in series with one another in a ring configuration, wherein each latch includes:
   a tri-state inverter with a first clock terminal and a second clock terminal;
   a first resistor-capacitor (RC) network that is coupled to the first clock terminal; and
   a second RC network that is coupled to the second clock terminal; and
   a biasing network having:
   a first bias voltage generator that is coupled to the first RC network for each latch; and a second bias voltage generator that is coupled to the second RC network for each latch, wherein the first RC network further comprises:
a capacitor that is coupled to the first clock terminal and that is configured to receive a clock signal; and
a resistor that is coupled to the first clock terminal and the first bias voltage generator,
wherein the capacitor, resistor, and clock signal further comprise a first capacitor, a first resistor, and a first clock signal, and wherein the second RC network further comprises:
a capacitor that is coupled to the first clock terminal and that is configured to receive a second clock signal; and
a resistor that is coupled to the first clock terminal and the first bias voltage generator,
wherein each of the resistors allow inner transistors of a first latch of the plurality of latches and the second latch of the plurality of latches to be biased through coupled each of the resistors such that the gate voltages of these transistors are near or above their respective threshold voltages during operation.

2. The apparatus of claim 1, wherein the tri-state inverter further comprises:
an input terminal;
an output terminal;
a first PMOS transistor that is coupled to the input terminal at its gate;
a second PMOS transistor that is coupled to the drain of the first PMOS transistor at its source, the first clock terminal at its gate, and the output terminal at its drain;
a first NMOS transistor that is coupled to the second clock terminal at its gate and the output terminal at its drain; and
a second NMOS transistor that is coupled to the source of the first NMOS transistor at its drain and the input terminal at its gate.

3. The apparatus of claim 2, wherein the first bias voltage generator further comprises:
a third PMOS transistor that is coupled to the first resistor of each latch at its gate and drain; and
an adjustable current source that is coupled to the gate and drain of the third PMOS transistor.

4. The apparatus of claim 3, wherein the adjustable current source further comprises a first adjustable current source, and wherein the second bias voltage generator further comprises:
a third NMOS transistor that is coupled to the second resistor of each latch at its gate and drain; and
an adjustable current source that is coupled to the gate and drain of the third NMOS transistor.

5. An apparatus comprising:
a first latch having:
a first tri-state inverter with a first input terminal, a first output terminal, a first clock terminal, and a second clock terminal;
a first resistor-capacitor (RC) network that is coupled to the first clock terminal, wherein the first RC network is configured to receive a first clock signal; and
a second RC network that is coupled to the second clock terminal, wherein the second RC network is configured to receive a second clock signal;
a second latch having:
a second tri-state inverter with a second input terminal, second output terminal, a third clock terminal, and a fourth clock terminal, wherein the second output terminal is coupled to the first input terminal;

a third resistor-capacitor (RC) network that is coupled to the third clock terminal, wherein the third RC network is configured to receive the second clock signal; and
a fourth RC network that is coupled to the fourth clock terminal, wherein the fourth RC network is configured to receive the first clock signal;
a biasing network having:
a first bias voltage generator that is coupled to the first and third RC networks; and
a second bias voltage generator that is coupled to the second and fourth RC networks; and
an inverter that is coupled to the first output terminal and the second input terminal,
wherein each of the first, second, third, and fourth RC networks further comprises:
a capacitor that is coupled to its clock terminal; and
a resistor that is coupled to its clock terminal and its bias voltage generator;
wherein each of the first and second tri-state inverters further comprises:
a first PMOS transistor;
a second PMOS transistor that is coupled to the drain of the first PMOS transistor at its source;
a first NMOS transistor that is coupled to the drain of the second PMOS transistor at its drain; and
a second NMOS transistor that is coupled to the source of the first NMOS transistor at its drain and the gate of the first PMOS transistor at its gate,
wherein each of the resistors allow inner transistors of a first latch of the plurality of latches and the second latch of the plurality of latches to be biased through coupled each of the resistors such that the gate voltages of these transistors are near or above their respective threshold voltages during operation.

6. The apparatus of claim 5, wherein the first bias voltage generator further comprises:
a third PMOS transistor that is coupled to the resistor of each of the first and third RC networks at its gate and drain; and
an adjustable current source that is coupled to the gate and drain of the third PMOS transistor.

7. The apparatus of claim 6, wherein the adjustable current source further comprises a first adjustable current source, and wherein the second bias voltage generator further comprises:
a third NMOS transistor that is coupled to the resistor of each of the second and fourth RC networks at its gate and drain; and
an adjustable current source that is coupled to the gate and drain of the third NMOS transistor.

8. An apparatus comprising:
a phase/frequency detector (PFD) that is configured to receive a reference signal;
a charge pump that is coupled to the PFD;
a low pass filter (LPF) that is coupled to the charge pump;
a voltage controller oscillator (VCO) that is coupled to the LPF, wherein the VCO has a first VCO terminal and a second VCO terminal; and
a divider having:
a first latch having:
a first tri-state inverter with a first input terminal, a first output terminal, a first clock terminal, and a second clock terminal;
a first resistor-capacitor (RC) network that is coupled to the first clock terminal, wherein the first RC network is coupled to the first VCO terminal; and a second RC network that is coupled to the second clock terminal, wherein the second RC network is coupled to the second VCO terminal;

a second latch having:
a second tri-state inverter with a second input terminal, a second output terminal, a third clock terminal, and a fourth clock terminal, wherein the second output terminal is coupled to the first input terminal and to the PFD;
a third resistor-capacitor (RC) network that is coupled to the third clock terminal, wherein the third RC network coupled to the second VCO terminal; and
a fourth RC network that is coupled to the fourth clock terminal, wherein the fourth RC network is coupled to the first VCO terminal;
a biasing network having:
a first bias voltage generator that is coupled to the first and third RC networks; and
a second bias voltage generator that is coupled to the second and fourth RC networks; and
an inverter that is coupled to the first output terminal and the second input terminal,
wherein each of the first, second, third, and fourth RC networks further comprises:
a capacitor that is coupled to its clock terminal; and
a resistor that is coupled to its clock terminal and its bias voltage generator,
wherein each of the first and second tri-state inverters further comprises:
a first PMOS transistor;
a second PMOS transistor that is coupled to the drain of the first PMOS transistor at its source;
a first NMOS transistor that is coupled to the drain of the second PMOS transistor at its drain; and
a second NMOS transistor that is coupled to the source of the first NMOS transistor at its drain and the gate of the first PMOS transistor at its gate,
wherein each of the resistors allow inner transistors of a first latch of the plurality of latches and the second latch of the plurality of latches to be biased through coupled each of the resistors such that the gate voltages of these transistors are near or above their respective threshold voltages during operation.

9. The apparatus of claim 8, wherein the first bias voltage generator further comprises:
a third PMOS transistor that is coupled to the resistor of each of the first and third RC networks at its gate and drain; and
an adjustable current source that is coupled to the gate and drain of the third PMOS transistor.

10. The apparatus of claim 9, wherein the adjustable current source further comprises a first adjustable current source, and wherein the second bias voltage generator further comprises:
a third NMOS transistor that is coupled to the resistor of each of the second and fourth RC networks at its gate and drain; and
an adjustable current source that is coupled to the gate and drain of the third NMOS transistor.

11. The apparatus of claim 10, wherein the VCO is configured to output first and second clock signals through the first and second VCO terminals, and wherein the second clock signal is an inverse of the first clock signal.

12. The apparatus of claim 11, wherein the divider is configured to divide the first and second clock signals by 2.

* * * * *